United States Patent
Fukui et al.

(10) Patent No.: US 9,425,261 B2
(45) Date of Patent: Aug. 23, 2016

(54) SILICON-CARBIDE SEMICONDUCTOR DEVICE AND METHOD FOR MANUFACTURING THE SAME

(71) Applicant: MITSUBISHI ELECTRIC CORPORATION, Chiyoda-ku (JP)

(72) Inventors: Yutaka Fukui, Tokyo (JP); Yasuhiro Kagawa, Tokyo (JP); Rina Tanaka, Tokyo (JP); Yuji Abe, Tokyo (JP); Masayuki Imaizumi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/650,718

(22) PCT Filed: Dec. 19, 2013

(86) PCT No.: PCT/JP2013/007461
§ 371 (c)(1),
(2) Date: Jun. 9, 2015

(87) PCT Pub. No.: WO2014/103256
PCT Pub. Date: Jul. 3, 2014

(65) Prior Publication Data
US 2016/0071937 A1 Mar. 10, 2016

(30) Foreign Application Priority Data
Dec. 28, 2012 (JP) .................. 2012-288406

(51) Int. Cl.
*H01L 29/73* (2006.01)
*H01L 29/16* (2006.01)
(Continued)

(52) U.S. Cl.
CPC ......... *H01L 29/1608* (2013.01); *H01L 21/046* (2013.01); *H01L 21/049* (2013.01);
(Continued)

(58) Field of Classification Search
None
See application file for complete search history.

(56) References Cited

U.S. PATENT DOCUMENTS 8,384,151 B2 * 2/2013 Pfirsch ............... H01L 29/0834
257/328
8,395,162 B2  3/2013 Nakano et al.
(Continued)

FOREIGN PATENT DOCUMENTS

JP  2005-333068 A  12/2005
JP  2007-281265 A  10/2007
(Continued)

OTHER PUBLICATIONS

U.S. Appl. No. 14/650,413, filed Jun. 8, 2015, Fukui, et al.
(Continued)

*Primary Examiner* — Benjamin Sandvik
(74) *Attorney, Agent, or Firm* — Oblon, McClelland, Maier & Neustadt, L.L.P.

(57) ABSTRACT

A silicon carbide semiconductor device that reduces an influence of an off-angle of a silicon carbide substrate on characteristics of the semiconductor device and achieves improved operational stability and reduced resistance. In a trench-gate silicon carbide MOSFET semiconductor device, a high-concentration well region is formed in a well region, and a distance from a first sidewall surface of a trench of the silicon carbide semiconductor to the high-concentration well region is smaller than a distance from a second sidewall surface of the trench to the high-concentration well region, the second sidewall surface facing the first sidewall surface of the trench through the gate electrode.

12 Claims, 15 Drawing Sheets

(51) Int. Cl.

| | | |
|---|---|---|
| *H01L 29/36* | (2006.01) | |
| *H01L 29/66* | (2006.01) | |
| *H01L 29/739* | (2006.01) | |
| *H01L 29/04* | (2006.01) | |
| *H01L 21/04* | (2006.01) | |
| *H01L 29/423* | (2006.01) | |
| *H01L 29/78* | (2006.01) | |
| *H01L 21/265* | (2006.01) | |
| *H01L 27/088* | (2006.01) | |
| *H01L 29/08* | (2006.01) | |
| *H01L 29/10* | (2006.01) | |
| *H01L 29/417* | (2006.01) | |

(52) U.S. Cl.
CPC ...... *H01L21/0475* (2013.01); *H01L 21/26586* (2013.01); *H01L 27/088* (2013.01); *H01L 29/045* (2013.01); *H01L 29/0865* (2013.01); *H01L 29/1095* (2013.01); *H01L 29/36* (2013.01); *H01L 29/41741* (2013.01); *H01L 29/4236* (2013.01); *H01L 29/66068* (2013.01); *H01L 29/66348* (2013.01); *H01L 29/66734* (2013.01); *H01L 29/739* (2013.01); *H01L 29/7397* (2013.01); *H01L 29/78* (2013.01); *H01L 29/7813* (2013.01); *H01L 29/7827* (2013.01)

(56) References Cited

U.S. PATENT DOCUMENTS

| | | |
|---|---|---|
| 8,563,981 B2 | 10/2013 | Nakano et al. |
| 8,686,439 B2 | 4/2014 | Takahashi et al. |
| 8,748,901 B1 | 6/2014 | Takahashi et al. |
| 2008/0038890 A1* | 2/2008 | Tucker ................ H01L 29/0623 438/270 |
| 2011/0017998 A1* | 1/2011 | Nakano ................ H01L 21/046 257/66 |
| 2012/0112266 A1* | 5/2012 | Tarui .................... H01L 23/544 257/329 |
| 2012/0181575 A1* | 7/2012 | Pfirsch ................ H01L 29/0834 257/139 |
| 2013/0001592 A1* | 1/2013 | Miyahara ............ H01L 29/4236 257/77 |
| 2014/0014972 A1 | 1/2014 | Nakano et al. |
| 2015/0340487 A1* | 11/2015 | Siemieniec ........... H01L 21/046 257/77 |

FOREIGN PATENT DOCUMENTS

| | | |
|---|---|---|
| JP | 2011-100967 A | 5/2011 |
| WO | WO 2013/001782 A1 | 1/2013 |

OTHER PUBLICATIONS

International Search Report issued Feb. 18, 2014, in PCT/JP2013/007461, filed Dec. 19, 2013.

Hitoshi Yano, et al., "Anomalously anisotropic channel mobility on trench sidewalls in 4*H*-SiC trench-gate metal-oxide-semiconductor field-effect transistors fabricated on 8° off substrates", Applied Physics Letters 90, 042102 (2007).

International Preliminary Report on Patentability and Written Opinion issued on Jun. 30, 2015 in PCT/JP2013/007461 (with English Translation).

* cited by examiner

F I G. 8
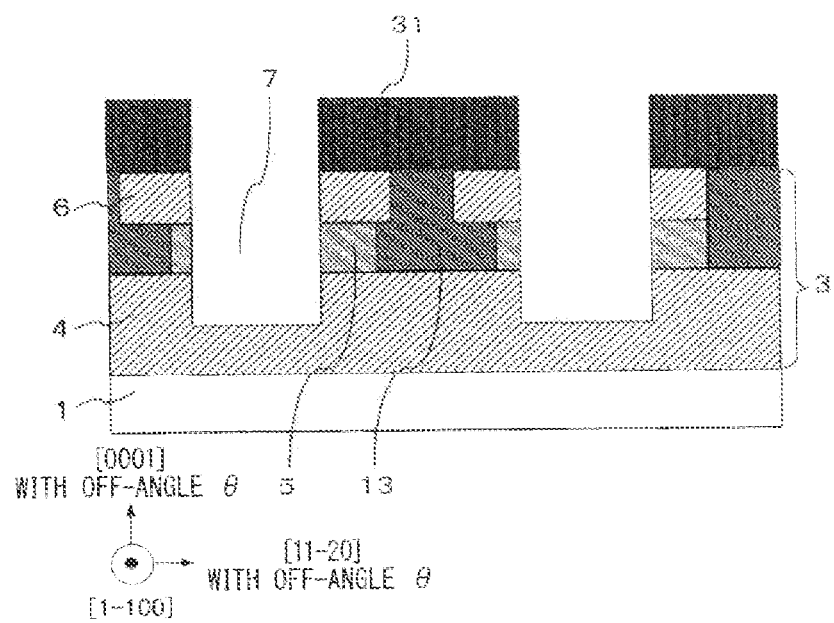
F I G. 9
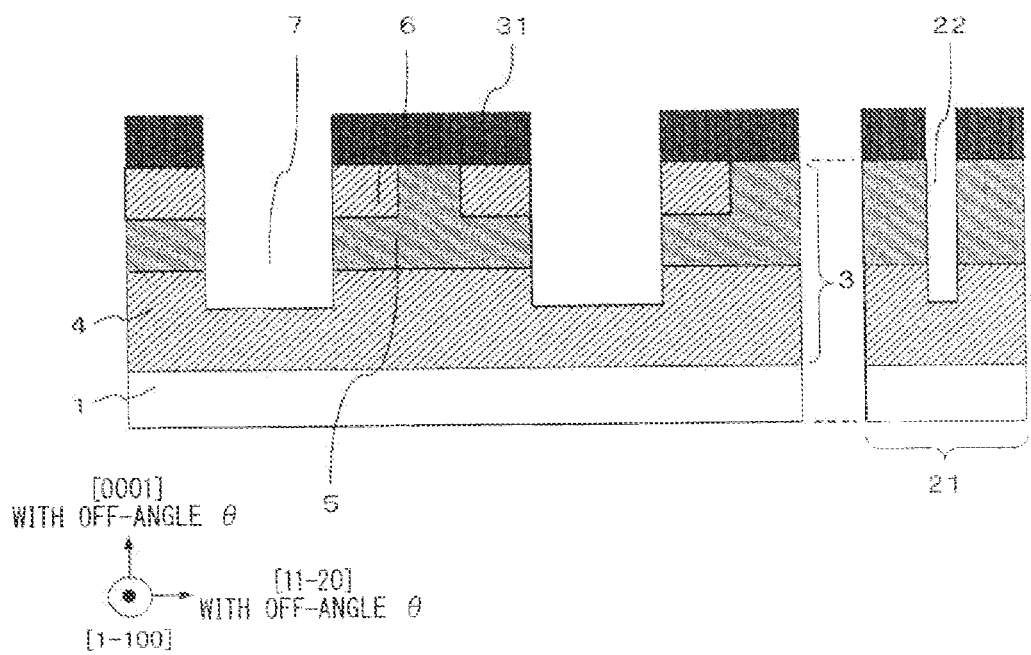

[0001]
WITH OFF-ANGLE θ

[1-100] · → [11-20]
WITH OFF-ANGLE θ

[-1100]

[0001] · → [11-20]
WITH OFF-ANGLE θ
WITH OFF-ANGLE θ

SILICON-CARBIDE SEMICONDUCTOR DEVICE AND METHOD FOR MANUFACTURING THE SAME

TECHNICAL FIELD

The present invention relates to a silicon carbide semiconductor device and more particularly to a trench-gate silicon carbide semiconductor device used as a power semiconductor device and to a manufacturing method therefor.

BACKGROUND ART

In power electronics equipment, switching elements, such as silicon insulated gate bipolar transistors (IGBTs) and metal oxide semiconductor field effect transistors (MOSFETs), are used to switch between execution and stop of power supply for driving loads such as electric motors. Particularly in recent times, as next-generation switching devices having a high breakdown voltage and a low loss, MOSFETs including silicon carbide (SiC) receive attention.

As a power semiconductor device, a vertical MOSFET structure is often used. The vertical MOSFET includes a planar type, a trench (trench-gate) type, or the like depending on its gate structure.

When a trench-gate SiC-MOSFET is formed on a substrate having an off-angle, such as 4° off, it has been known that an on-current and a threshold voltage are changed depending on sidewall surfaces of a trench being formed (for example, Patent Document 1).

PRIOR ART DOCUMENT

Patent Document

Patent Document 1: Japanese Patent Application Laid-Open No. 2011-100967

SUMMARY OF INVENTION

Problems to be Solved by the Invention

According to Patent Document 1, in a trench-gate SiC-MOSFET formed of a 4H-SiC single-crystal semiconductor substrate having an off-angle, variations in a drain current and a threshold voltage occur in each of sidewall surfaces of a trench having different crystal surfaces due to a dependence on the off-angle. In other words, in the trench-gate SiC-MOSFET formed on the substrate having the off-angle, a MOSFET is in a different ON state in each of the sidewall surfaces of the trench, so that dynamic characteristics may become unstable or a current concentration may occur in a channel surface of the particular sidewall surface of the trench in some cases.

The present invention has been made in view of the above-mentioned problems, and an object thereof is to provide a trench-gate vertical silicon carbide semiconductor device capable of reducing variations in a drain current and a threshold voltage due to crystal surfaces of sidewall surfaces of a trench and to provide a manufacturing method therefor.

Means to Solve the Problems

A silicon carbide semiconductor device of the present invention includes: a drift region of a first conductivity type that is formed on a first main surface of a silicon carbide semiconductor substrate having an off-angle and is made of silicon carbide; a well region of a second conductivity type that is formed on a surface of the drift region and is made of silicon carbide; a source region of the first conductivity type that is selectively formed in a surface layer portion of the well region and is made of silicon carbide; a trench that penetrates the well region from a surface of the source region and reaches the drift region; a gate electrode that is formed inside the trench through a gate insulating film; a source electrode that is connected to the well region and the source region; a drain electrode that is formed on a second main surface while being in contact with the silicon carbide semiconductor substrate, the second main surface being a surface opposite to the first main surface of the silicon carbide semiconductor substrate; and a high-concentration well region of the second conductivity type that is formed in the well region and has an impurity concentration higher than that of the well region. A distance from a first sidewall surface of the trench to the high-concentration well region is shorter than a distance from a second sidewall surface of the trench to the high-concentration well region, the second sidewall surface facing the first sidewall surface of the trench through the gate electrode in the trench.

A method for manufacturing a silicon carbide semiconductor device includes: forming a drift region of a first conductivity type made of silicon carbide on a first main surface of a silicon carbide semiconductor substrate having an off-angle; forming a well region of a second conductivity type made of silicon carbide on a surface of the drift region; forming a source region of the first conductivity type made of silicon carbide selectively in a surface layer portion of the well region; forming a trench that penetrates the well region from a surface of the source region and reaches the drift region; forming a gate electrode inside the trench through a gate insulating film; forming a source electrode in contact with the well region and the source region; forming a drain electrode on a second main surface being a surface opposite to the first main surface of the silicon carbide semiconductor substrate; and forming, in the well region, a high-concentration well region of the second conductivity type having a second conductivity-type impurity concentration higher than that of the well region such that a distance from a first sidewall surface of the trench is shorter than a distance from a second sidewall surface of the trench, the second sidewall surface facing the first sidewall surface of the trench through the gate electrode in the trench.

Effects of the Invention

According to the present invention, an ON state of each sidewall surface of a trench can be adjusted, so that a current concentration in a channel surface of a field-effect transistor formed in a particular sidewall surface of the trench can be prevented. Thus, a trench-gate silicon carbide semiconductor device having lower resistance or a silicon carbide semiconductor device having higher operational stability and higher reliability can be obtained.

BRIEF DESCRIPTION OF DRAWINGS

FIG. 8 is a schematic cross-sectional view schematically showing the method for manufacturing the silicon carbide semiconductor device in the first embodiment of the present invention.

FIG. 9 is a schematic cross-sectional view schematically showing the method for manufacturing the silicon carbide semiconductor device in the first embodiment of the present invention.

DESCRIPTION OF EMBODIMENTS

First Embodiment

First, a configuration of a silicon carbide semiconductor device in a first embodiment of the present invention will be described. Herein, it will be described assuming that a first conductivity type is an n-type and a second conductivity type is a p-type.

Figure 1:
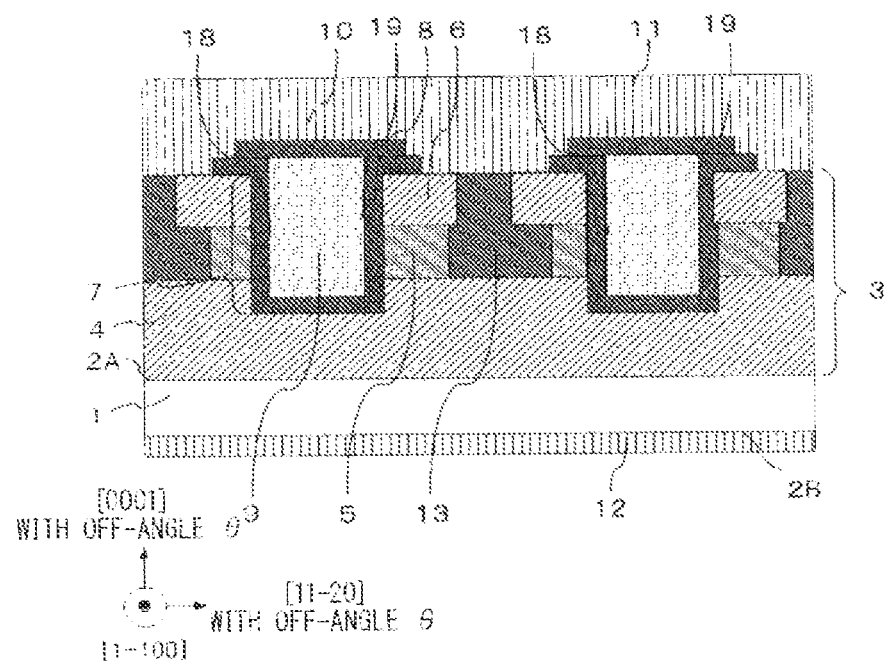
FIG. 1 is a cross-sectional view schematically showing a silicon carbide semiconductor device in a first embodiment of the present invention.
Figure 2:
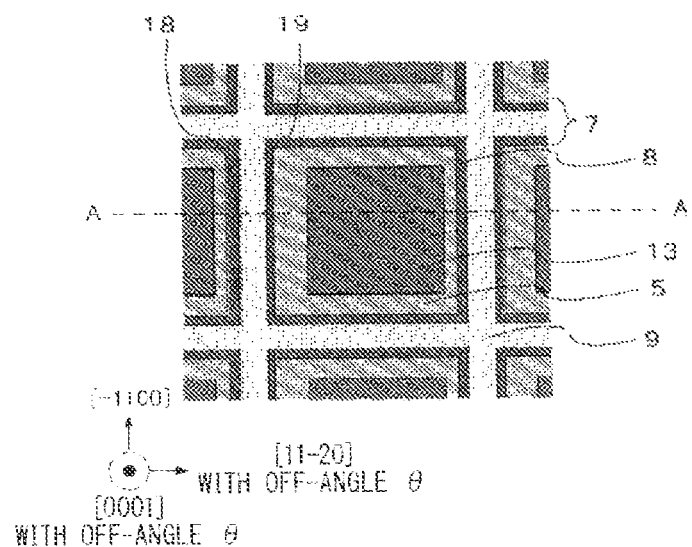
FIG. 2 is a plan view schematically showing the silicon carbide semiconductor device in the first embodiment of the present invention.

FIG. 1 is a cross-sectional view schematically showing the silicon carbide semiconductor device in the first embodiment of the present invention. FIG. 2 is a plan view schematically showing the configuration of the silicon carbide semiconductor device in FIG. 1. FIG. 1 is a cross-sectional view of an A-A broken line portion in FIG. 2. The silicon carbide semiconductor device in FIG. 1 and FIG. 2 is a vertical trench-gate MOSFET.

In FIG. 1, a drift region 4 of the n-type made of silicon carbide is formed on a first main surface 2A of a silicon carbide semiconductor substrate 1 that includes the first main surface 2A as a front surface and has a polytype of 4H, the first main surface 2A being tilted only an off-angle θ in an [11-20] axis direction to a (0001) plane. A well region 5 of the p-type made of silicon carbide is formed on a front surface of the drift region 4. A source region 6 of the n-type is selectively formed in a surface layer portion of the well region 5.

A trench 7 that penetrates the well region 5 from the front surface of the source region 6 and reaches the drift region 4 is formed. A gate electrode 9 is formed so as to be embedded in the trench 7 through a gate insulating film 8 inside the trench 7. Moreover, an interlayer insulating film 10 is formed so as to cover the gate insulating film 8 and the gate electrode 9, and a source electrode 11 is formed in a position in which part of the interlayer insulating film 10 is removed so as to be in contact with the source region 6 and the well region 5 or with a region electrically connected thereto. Furthermore, a drain electrode 12 is formed so as to be in contact with a second main surface 2B being a surface opposite to the first main surface 2A of the silicon carbide semiconductor substrate 1.

A high-concentration well region 13 is formed in the well region 5 spaced at only a first distance d1 from a first sidewall surface 18 of the trench 7, and the high-concentration well region 13 is formed in the well region 5 spaced at only a second distance $d_2$ from a second sidewall surface 19 of the trench 7. Here, the first sidewall surface 18 and the second sidewall surface 19 are surfaces facing each other through the gate electrode 9 in the trench 7, and the first distance d1 is shorter than the second distance d2.

In addition, in FIG. 1, an upper side of the paper plane is a [0001] direction with the off-angle θ, and a right side of the paper plane is the [11-20] direction with the off-angle θ.

Also in FIG. 2, the gate electrode 9 is formed inside the trench 7 formed in a grid shape in a plan view through the gate insulating film 8, and a distance between the high-concentration well region 13 and the side wall of the trench 7 is shorter on the first sidewall surface 18 side that is a side wall on the [11-20] direction side in the well region 5 while being greater on the second sidewall surface 19 side that is a side wall on a [-1-120] direction side in the well region 5.

In FIG. 2, the upper side of the paper plane is a [-1100] direction, and the right side of the paper plane is the [11-20] direction with the off-angle θ.

Figure 3:
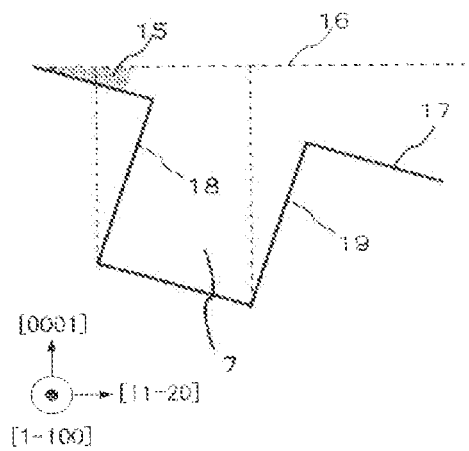
FIG. 3 is a schematic cross-sectional view for describing a relationship of a crystal surface of a trench in the silicon carbide semiconductor device in the first embodiment of the present invention.

Here, regarding the first sidewall surface 18 and the second sidewall surface 19 of the trench 7, a relationship of a crystal surface is described with reference to FIG. 3. FIG. 3 is a schematic cross-sectional view for describing the relationship of the crystal surface of the trench 7 in the first embodiment of the present invention.

In FIG. 3, the upper side of the paper plane is the [0001] direction, the right side of the paper plane is the [11-20] direction, a surface 16 is exactly the (0001) plane, a surface 17 is the (0001) plane having the off-angle θ, and an angle 15 is the off-angle θ.

The silicon carbide semiconductor substrate 1 in this embodiment has the first main surface 2A, as the front surface, being tilted the off-angle θ in the [11-20] direction to the (0001) plane, so that in the trench 7 of the trench-gate MOSFET in this embodiment, the first main surface 2A corresponds to the surface 17 in FIG. 3, and the first sidewall surface 18 and the second sidewall surface 19 respectively correspond to a surface 18 and a surface 19 in FIG. 3.

In the relationship as described above, the first sidewall surface 18 and the second sidewall surface 19 of the trench 7 of the trench-gate MOSFET in this embodiment are a (11-20) plane having the off-angle θ and a (-1-120) plane having the off-angle θ, respectively.

In addition, when it comes to the sidewall surfaces of the trench 7 being a (1-100) plane and a (-1100) plane that are respectively orthogonal to the first sidewall surface 18 and the second sidewall surface 19 in FIG. 2, a distance $d_3$ between the side wall of the trench 7 and the high-concentration well region 13 is set to a distance between the distance $d_1$ between the first sidewall surface 18 and the high-concentration well region 13 and the distance $d_2$ between the second sidewall surface 19 and the high-concentration well region 13.

Next, an operation of the trench-gate MOSFET being the silicon carbide semiconductor device in this embodiment of the present invention will be described in detail.

Figure 4:
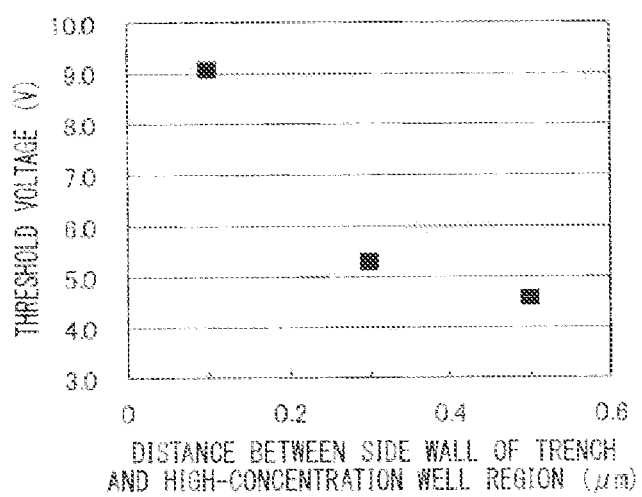
FIG. 4 is a diagram for describing a dependence of a threshold voltage of a MOSFET formed in a side wall of the trench on a distance between the sidewall surface of the trench and a high-concentration well region, regarding the silicon carbide semiconductor device in the first embodiment of the present invention.

FIG. 4 is a result of performing a device simulation of a relationship between a distance between the high-concentration well region 13 and the sidewall surface of the trench 7 and a threshold voltage, in cases where three different distances between the high-concentration well region 13 and the side surfaces of the gate trench 7 are 0.5 µm, 0.3 µm, and 0.1 µm while the trench 7 has a depth of 1.2 µm, the well region 5 has an acceptor concentration of $3 \times 10^{17}/cm^3$, the well region 5 has a depth of 0.9 µm, the high-concentration well region 13 has an acceptor concentration of $1 \times 10^{18}/cm^3$, the high-concentration well region 13 has a depth of 0.9 and the gate insulating film 8 is $SiO_2$ having a thickness of 50 nm.

Figure 5:
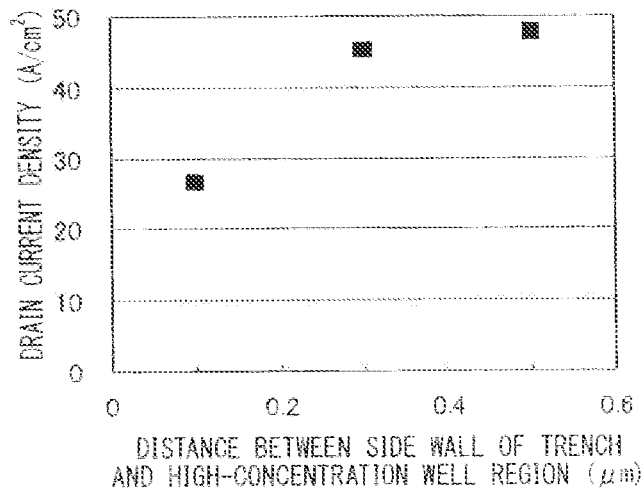
FIG. 5 is a diagram for describing a dependence of a drain current density of the MOSFET formed in the side wall of the trench on the distance between the sidewall surface of the trench and the high-concentration well region, regarding the silicon carbide semiconductor device in the first embodiment of the present invention.

FIG. 5 is a result of performing a device simulation of a drain current density when a gate voltage is 15 V for the distance between the high-concentration well region 13 and the sidewall surface of the trench 7, in the trench-gate MOSFET combined as shown in FIG. 4.

As shown in FIG. 4, the threshold voltage increases with a decrease in the distance between the high-concentration well region 13 and the side wall of the trench 7. At this time, the threshold voltage when being standardized at a maximum value is changed in a range of 0.5 to 1.

As shown in FIG. 5, the drain current density decreases with the decrease in the distance between the high-concentration well region 13 and the side wall of the trench 7.

These results can be described as results of the change in a fermi level close to a conductive channel region formed in the well region 5 in the sidewall surfaces of the trench 7 at the time of ON of the MOSFET by changing the horizontal distance between the high-concentration well region 13 and the side surface of the trench 7.

Thus, the results in FIG. 4 and FIG. 5 indicate that the ON states of the sidewall surfaces of the trench 7 can be adjusted by adjusting the distances between the high-concentration well region 13 and the sidewall surfaces of the trench 7.

Patent Document 1 discloses that a threshold voltage is fluctuated by a surface of a trench, and the threshold voltage of a field-effect transistor formed in each of the sidewall surfaces of the trench 7 can be leveled out by taking the contents of Patent Document 1 and the results of FIGS. 4 and 5 into consideration. For the sidewall surface of the trench 7 having a low threshold voltage of the field-effect transistor when the distance between the high-concentration well region 13 and the side surface of the trench 7 is a constant value, the distance between the sidewall surface of the trench 7 and the high-concentration well region 13 is made shorter. For the sidewall surface of the trench 7 having a high threshold voltage when the distance between the high-concentration well region 13 and the side surface of the trench 7 is a constant value, the distance between the sidewall surface of the trench 7 and the high-concentration well region 13 is made longer. Consequently, the trench-gate MOSFET having the identical threshold voltages in each of the inner wall surfaces of the trench 7 can be formed.

Additionally, in a case where the well region 5 has the acceptor concentration of $3 \times 10^{17}/cm^3$, the high-concentration well region 13 has the acceptor concentration of approximately $1 \times 10^{18}/cm^3$, and the off-angle $\theta$ is $8°$, the distance between the sidewall surface of the trench 7 and the high-concentration well region 13 is assumed to be, for example, 0.05 to 0.3 μm for the sidewall surface of the trench 7 having the low threshold voltage of the field-effect transistor, and the distance between the sidewall surface of the trench 7 and the high-concentration well region 13 is assumed to be, for example, 0.35 μm or more for the sidewall surface of the trench 7 being an opposed surface, the distance between the high-concentration well region 13 and the side surface of the trench 7 being the constant value. Consequently, the trench-gate MOSFET having the identical threshold voltages can be formed more effectively.

Moreover, in a case where the well region 5 has the acceptor concentration of $3 \times 10^{17}/cm^3$, the high-concentration well region 13 has the acceptor concentration of approximately $1 \times 10^{18}/cm^3$, and the off-angle $\theta$ is $4°$, the distance between the sidewall surface of the trench 7 and the high-concentration well region 13 is assumed to be, for example, 0.05 to 0.45 μm for the sidewall surface of the trench 7 having the low threshold voltage of the field-effect transistor, and the distance between the sidewall surface of the trench 7 and the high-concentration well region 13 is assumed to be, for example, 0.50 μm or more for the sidewall surface of the trench 7 being an opposed surface, the distance between the high-concentration well region 13 and the side surface of the trench 7 being the constant value. Consequently, the trench-gate MOSFET having the identical threshold voltages can be formed more effectively.

Furthermore, in a case where the well region 5 has the acceptor concentration of $3 \times 10^{17}/cm^3$, the high-concentration well region 13 has the acceptor concentration of approximately $1 \times 10^{18}/cm^3$, and the off-angle $\theta$ is less than or equal to $4°$, the distance between the sidewall surface of the trench 7 and the high-concentration well region 13 is assumed to be, for example, 0.05 to 0.5 μm for the sidewall surface of the trench 7 having the low threshold voltage of the field-effect transistor, and the distance between the sidewall surface of the trench 7 and the high-concentration well region 13 is assumed to be, for example, 0.55 μm or more for the sidewall surface of the trench 7 being an opposed surface, the distance between the high-concentration well region 13 and the side surface of the trench 7 being the constant value. Consequently, the trench-gate MOSFET having the identical threshold voltages can be formed more effectively.

In addition, the acceptor concentrations of the well region 5 and the high-concentration well region 13 and the off-angle $\theta$ are not limited to the cases mentioned above. The distance between the high-concentration well region 13 and the side surface of the trench 7 and impurity concentrations of the well region 5 and the high-concentration well region 13 are adjusted correspondingly to a disparity in the threshold voltage generated when the distance between the high-concentration well region 13 and the side surface of the trench 7 is the constant value, whereby the trench-gate MOSFET having the identical threshold voltages can be formed more effectively.

Next, a method for manufacturing the trench-gate MOSFET being the silicon carbide semiconductor device in this embodiment of the present invention will be described with reference to FIGS. 6 to 8.

First, an epitaxial layer 3 of the n-type that is made of silicon carbide and has relatively high resistance is epitaxially grown on the silicon carbide semiconductor substrate 1 of the n-type that includes the surface, as the front surface, tilted only the off-angle $\theta$ in the [11-20] axis direction to the (0001) plane and has the polytype of 4H. Then, an alignment mark, which is not shown, is formed by a reactive ion etching method (RIE method). Subsequently, the well region 5 of the p-type, the source region 6 of the n-type having the low resistance, and a well contact region of the p-type having the low resistance, which is not shown, are formed on the front surface of the epitaxial layer 3 by an ion implantation with reference to the alignment mark. The epitaxial layer 3 in which the well region 5 or the like is not formed is to be the drift region 4. As a result, a structure whose cross-sectional view is shown in FIG. 6 is formed. At this time, for example, the source region 6 may be formed of a donor impurity concentration of $1 \times 10^{19}/cm^3$ or more, the well region 5 may be formed of an acceptor impurity concentration of approximately $1 \times 10^{16}/cm^3$ to $5 \times 10^{17}/cm^3$, and the well contact region may be formed of an acceptor impurity concentration of $1 \times 10^{20}/cm^3$ or more.

Figure 7:
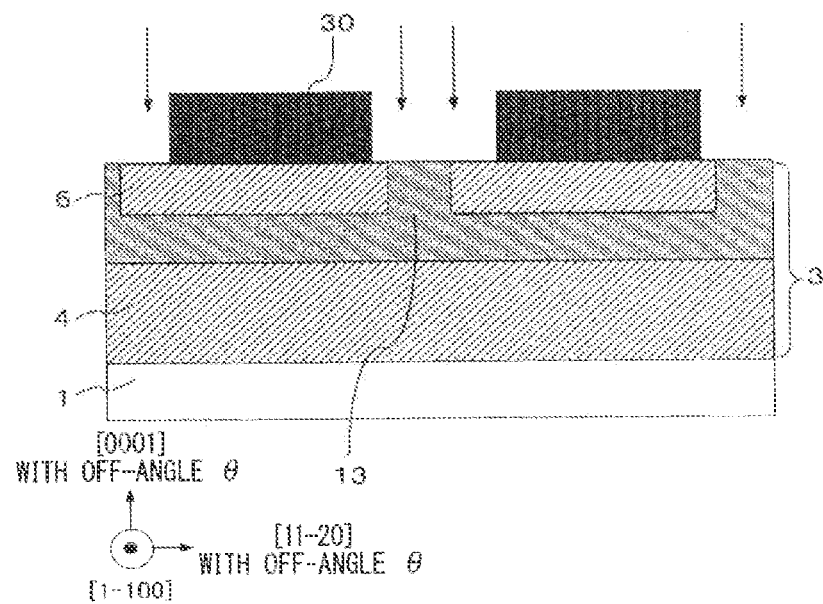
FIG. 7 is a schematic cross-sectional view schematically showing the method for manufacturing the silicon carbide semiconductor device in the first embodiment of the present invention.

Next, as shown in FIG. 7, a resist mask 30 is formed on a predetermined portion, and the high-concentration well region 13 is formed by the ion implantation. The high-concentration well region 13 may have a concentration higher than that of the well region 5 and may also be formed of the acceptor impurity concentration of approximately $5 \times 10^{17}/cm^3$ to $5 \times 10^{18}/cm^3$. After the ion implantation, the resist mask 30 is removed.

Next, as shown in FIG. 8, another resist mask 31 for forming the trench 7 is formed. After the resist mask 31 is formed, the trench 7 that has a depth deeper than that of the well region 5 and reaches the drift region 4 is formed by the RIE method. Then, after the resist mask 31 is removed, an activation annealing in a temperature range of 1500 to 2200° C. and in a range of 0.5 to 60 minutes is performed. Next, the gate insulating film 8 made of $SiO_2$ having a thickness of approximately 50 nm and the gate electrode 9 made of a doped polysilicon material are successively formed inside the trench 7. After the interlayer insulating film 10 is formed, the source electrode 11 and the drain electrode 12 are formed on an upper portion of the well contact of the p-type and a back surface of the substrate 1, respectively, whereby the trench-gate MOSFET that is the silicon carbide semiconductor device having the cell structure as shown in FIG. 1 can be manufactured. Here, the well contact of the p-type is part of the well region 5, and the well region 5 is electrically connected to the source electrode 11.

Figure 10:
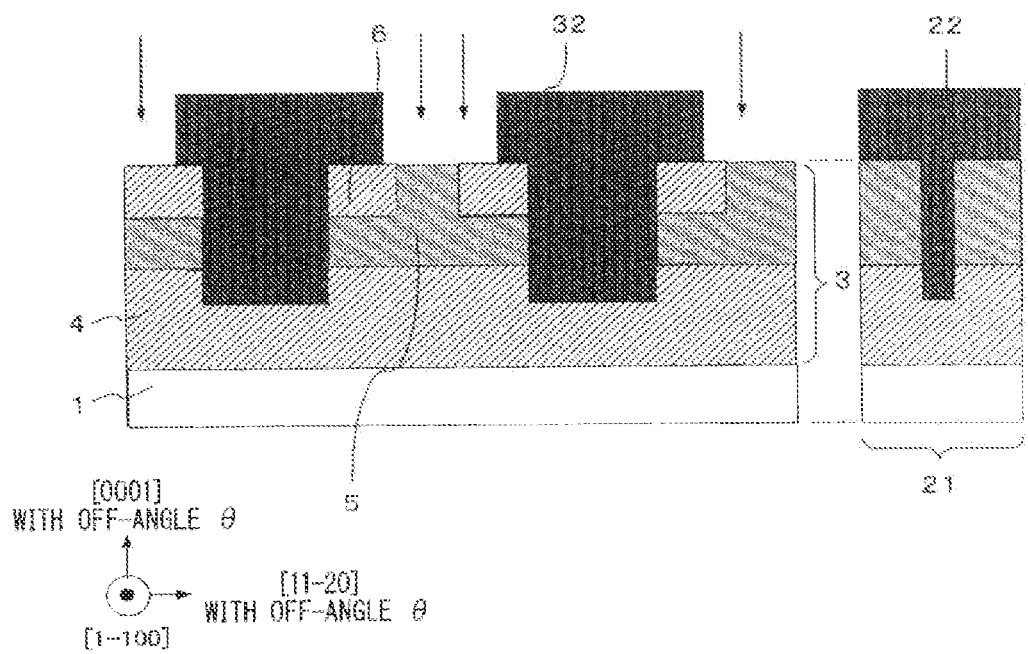
FIG. 10 is a schematic cross-sectional view schematically showing the method for manufacturing the silicon carbide semiconductor device in the first embodiment of the present invention.

In addition, the high-concentration well region 13 may be formed by performing the ion implantation after the trench 7 is etched. In other words, after the trench 7 is formed as shown in FIG. 9, a resist mask 32 is formed so as to cover the trench 7 or the like as shown in FIG. 10, and ion is implanted to the high-concentration well region 13. At this time, a mark 22 is formed in a mark forming region 21 simultaneously with the formation of the trench 7. The resist mask 32 for forming the high-concentration well region 13 is provided with reference to the mark 22, and then the ion implantation is performed. The trench 7 and the high-concentration well region 13 are formed in the stated order, whereby the position of the high-concentration well region 13 with respect to the trench 7 can be controlled more accurately.

Moreover, as the cross-sectional views of the manufacturing method shown in FIGS. 11 to 14, an implantation mask for the high-concentration well region 13 and an etching mask for the trench 7 may be simultaneously formed.

Figure 6:
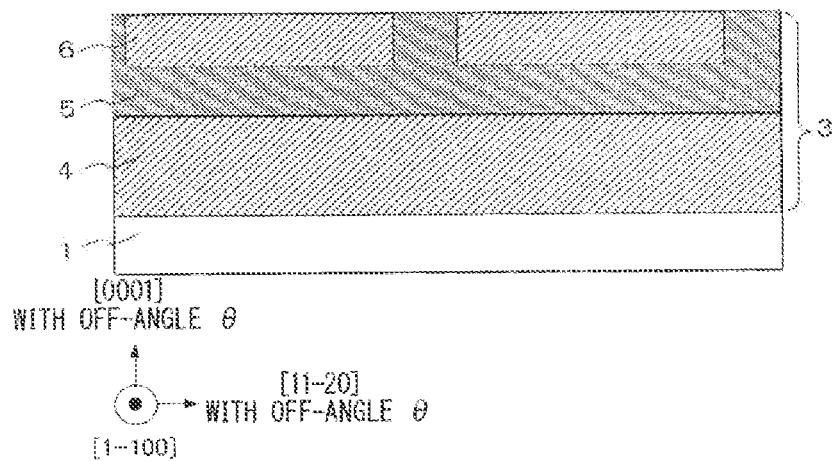
FIG. 6 is a schematic cross-sectional view schematically showing a method for manufacturing the silicon carbide semiconductor device in the first embodiment of the present invention.
Figure 11:
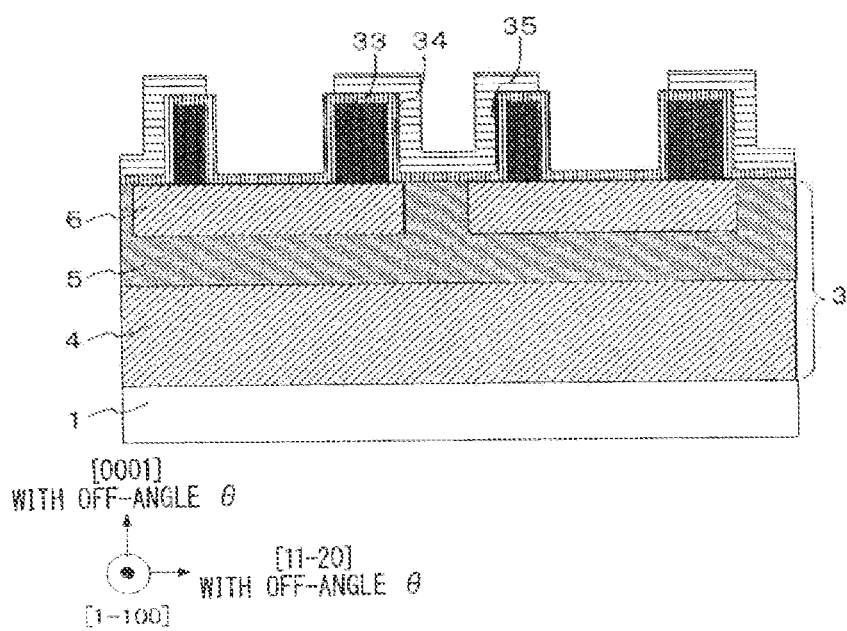
FIG. 11 is a schematic cross-sectional view schematically showing one aspect of the method for manufacturing the silicon carbide semiconductor device in the first embodiment of the present invention.

First, as shown in FIG. 11, a mask 33 made of an inorganic material, such as silicon oxide, for forming the trench 7 and the high-concentration well region 13 is formed on the configuration in FIG. 6 described before, and then a mask 34 made of an inorganic material, such as metal, is formed on the mask 33 so as to cover the mask 33 and the front surface of the epitaxial layer 3. Furthermore, a mask 35 made of an organic material or an inorganic material is formed on the mask 34 so as to cover the implanted portion of the high-concentration well region 13.

Figure 12:
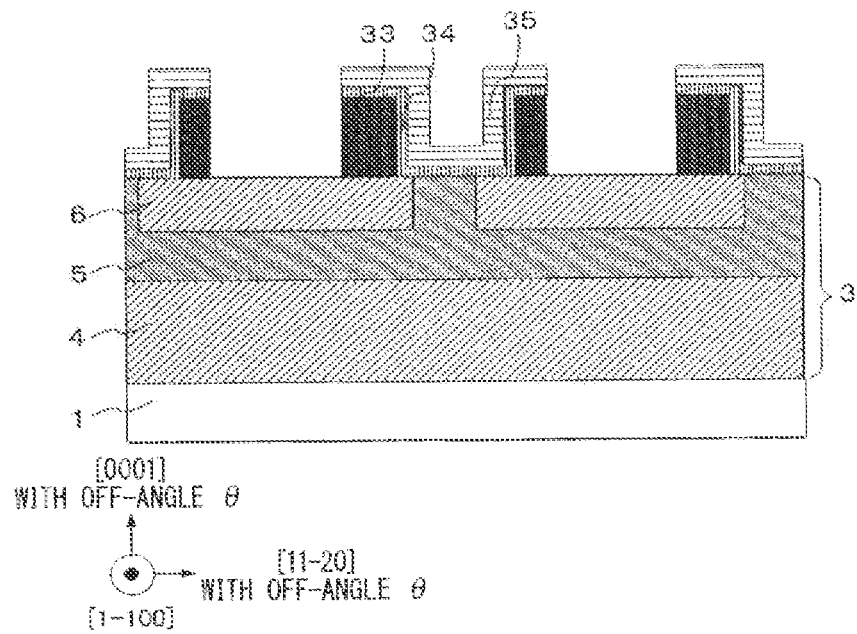
FIG. 12 is a schematic cross-sectional view schematically showing one aspect of the method for manufacturing the silicon carbide semiconductor device in the first embodiment of the present invention.
Figure 13:
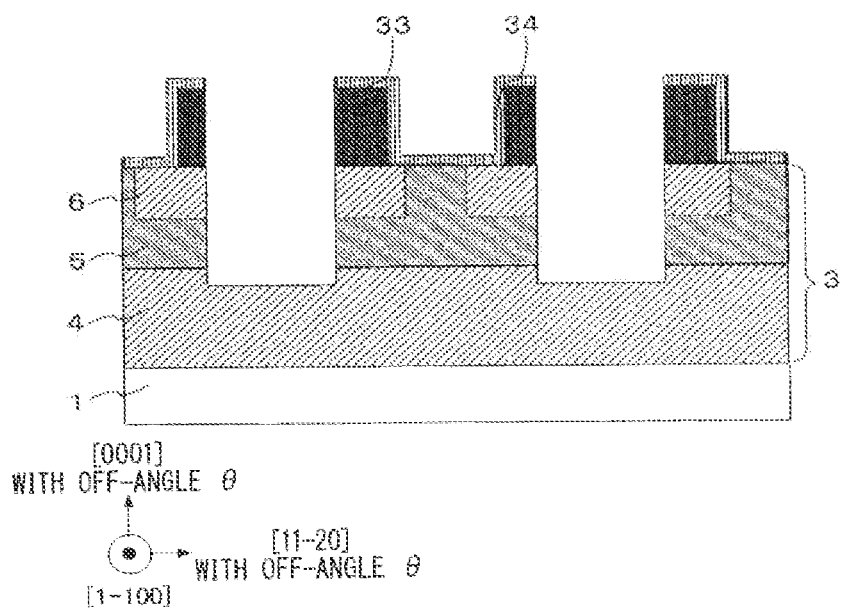
FIG. 13 is a schematic cross-sectional view schematically showing one aspect of the method for manufacturing the silicon carbide semiconductor device in the first embodiment of the present invention.
Figure 14:
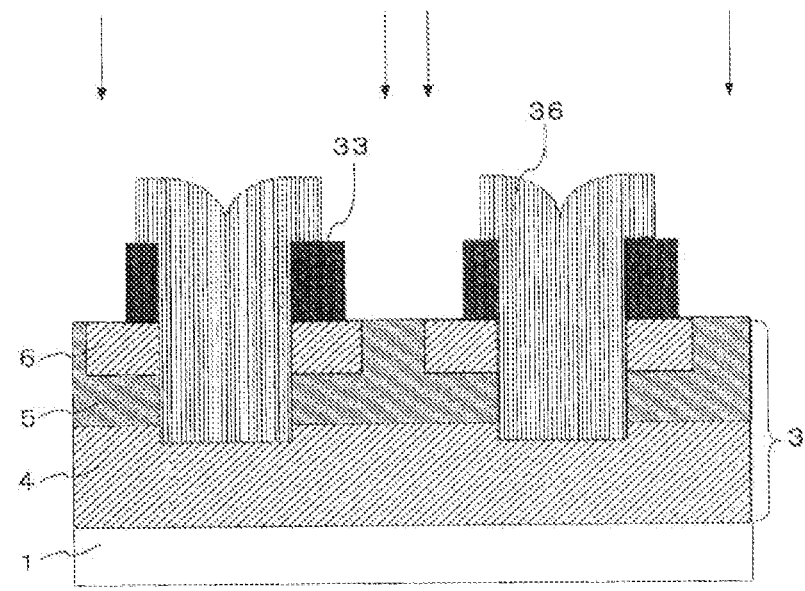
FIG. 14 is a schematic cross-sectional view schematically showing one aspect of the method for manufacturing the silicon carbide semiconductor device in the first embodiment of the present invention.

Next, as shown in FIG. 12, the mask 34 that is not covered by the mask 35 is selectively removed. Then, after removal of the mask 35, the trench 7 is formed by etching, as shown in FIG. 13. Next, after the mask 34 is selectively removed, a mask 36 is embedded in the trench 7 and formed so as not to protrude to the implanted portion of the high-concentration well region 13, and then the ion implantation is performed for forming the high-concentration well region 13, as shown in FIG. 14. After the ion implantation, the mask 33 and the mask 36 are removed.

Figure 15:
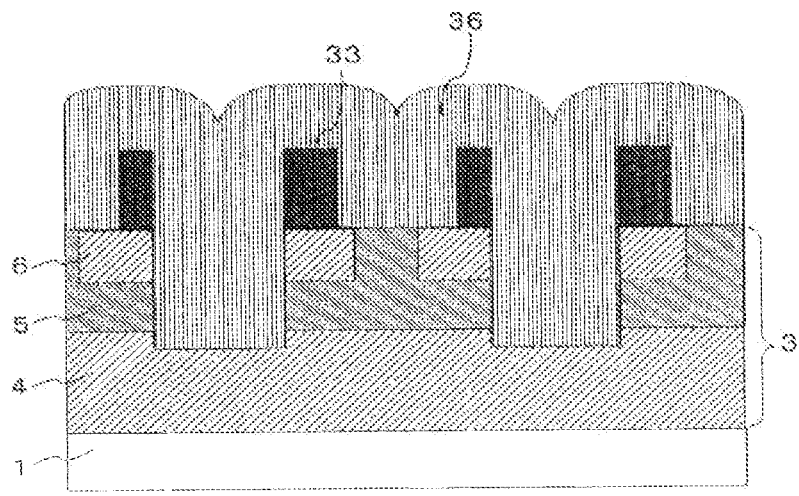
FIG. 15 is a schematic cross-sectional view schematically showing one aspect of the method for manufacturing the silicon carbide semiconductor device in the first embodiment of the present invention.
Figure 16:
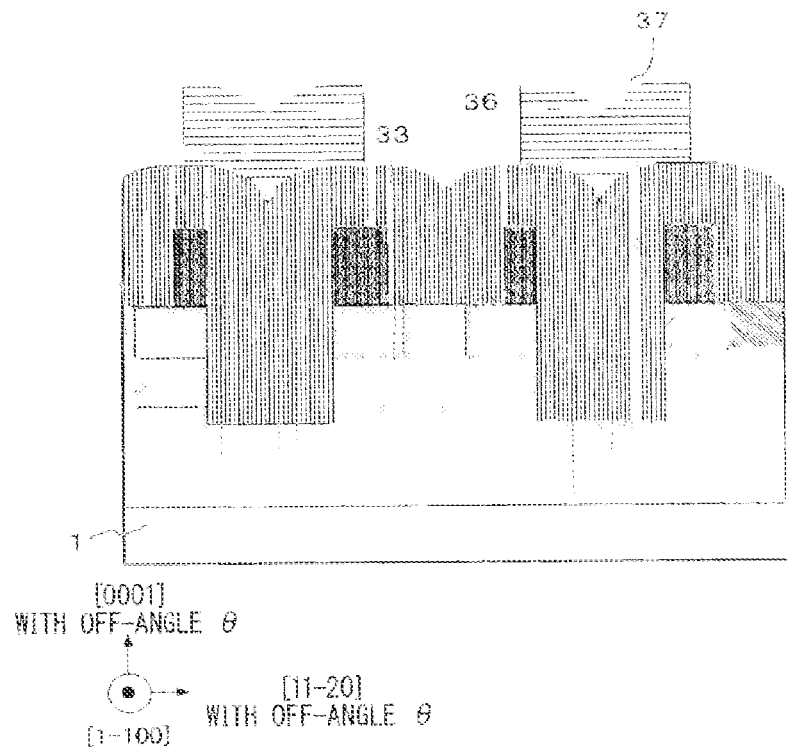
FIG. 16 is a schematic cross-sectional view schematically showing one aspect of the method for manufacturing the silicon carbide semiconductor device in the first embodiment of the present invention.

Herein, the mask 36 may be formed as shown in FIG. 15 and FIG. 16. First, as shown in FIG. 15, the mask 33 and the selective layer of the mask 36 are entirely formed so as to be embedded in the trench 7. Next, as shown in FIG. 16, a resist mask 37 is formed in a portion corresponding to the trench 7 on the upper portion of the layer of the mask 36. Then, the resist mask 37 is used to form the mask 36.

This manufacturing method can determine a distance between the side wall of the trench 7 and the high-concentration well region 13 by one mask (mask 33 herein), and can form the distance between the side wall of the trench 7 and the high-concentration well region 13 more accurately.

In addition, in this embodiment, the first main surface 2A of the silicon carbide semiconductor substrate 1 is assumed to be the (0001) plane having the off-angle θ tilted in the [11-20] axis direction, but even in a case where the first main surface 2A is assumed to be a (000-1) plane having the off-angle θ tilted in the [11-20] axis direction, variations in the drain current and the threshold voltage due to the crystal surfaces of the sidewall surfaces of the trench 7 can be suppressed by manufacturing the trench-gate MOSFET having the similar cell structure.

Specifically, as regards each of the four sidewall surfaces of the grid-shaped trench 7 of the trench-gate MOSFET having the rectangular cell structure in the plan view, the high-concentration well region 13 is located close to the sidewall surface of the trench 7 tilted closest to the (11-20) plane that is tilted in the [11-20] axis direction and has the off-angle θ, the high-concentration well region 13 is located away from the sidewall surface of the trench 7 tilted closest to the (-1-120) plane being the opposed surface that is tilted in the [11-20] axis direction and has the off-angle θ, and for the side surfaces of the gate trench 7 tilted closest to the (1-100) plane and the (-1100) plane, the distance between the side wall of the trench 7 and the high-concentration well region 13 may be set to a distance therebetween.

In the present invention, the trench 7 is assumed to be formed perpendicularly to the first main surface 2A of the silicon carbide semiconductor substrate 1, namely, the front surface of the epitaxial layer 3, and effects similar to those when the sidewall surfaces of the trench 7 are perpendicular are obtained also in a trench-gate SiC-MOSFET in which the sidewall surfaces of the trench 7 have a tapered angle to some extent with respect to the first main surface 2A.

In addition, this embodiment gives descriptions about forming the well region 5 of the p-type by the ion-implantation method, but the well region 5 may be formed by the epitaxial method subsequent to the drift region 4 instead of the ion-implantation method.

The off-angle of approximately 1° or more and 10° or less, for example, is effective. The off-angle exceeding 30° reduces the influence of the point in the present invention, so that the off-angle is 30° at most.

Figure 17:
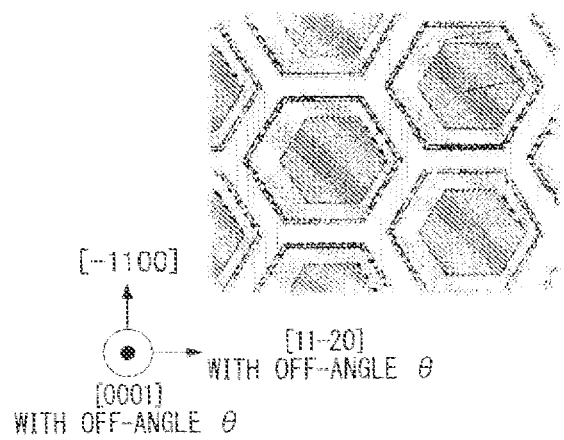
FIG. 17 is a plan view schematically showing one aspect of the silicon carbide semiconductor device in the first embodiment of the present invention.
Figure 18:
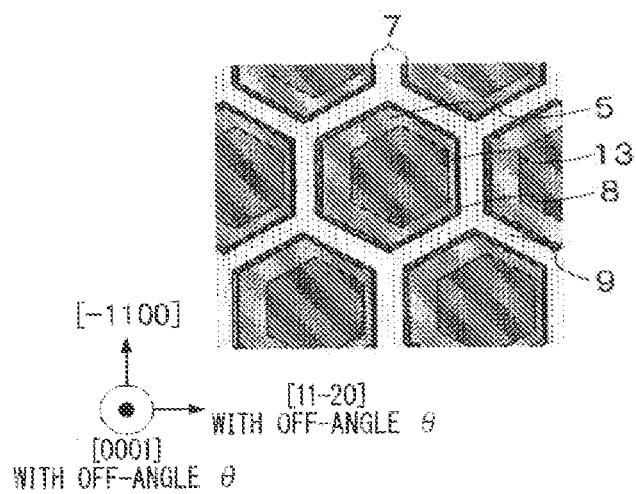
FIG. 18 is a plan view schematically showing one aspect of the silicon carbide semiconductor device in the first embodiment of the present invention.

Moreover, this embodiment gives descriptions with reference to the trench-gate MOSFET having the cell structure in the rectangular shape, such as a square, in the plan view, but the cell structure is not limited to this and may be a hexagonal cell structure in the plan view, as shown in the plan views in FIG. 17 and FIG. 18. In FIG. 17, two of the sidewall surfaces of the trench 7 close to the [11-20] axis direction and the high-concentration well region 13 have a minimum distance therebetween, and two of the sidewall surfaces of the trench 7 close to the opposite direction from the [11-20] axis direction and the high-concentration well region 13 have a maximum distance therebetween.

Figure 19:
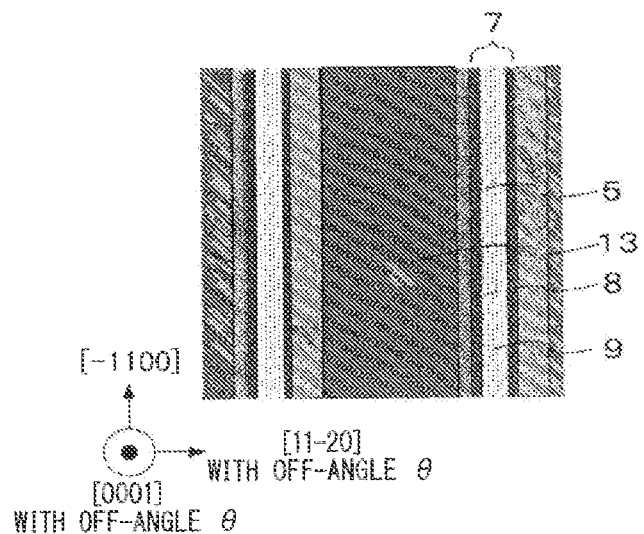
FIG. 19 is a plan view schematically showing one aspect of the silicon carbide semiconductor device in the first embodiment of the present invention.

Further, a cell structure whose plan view is shown in FIG. 19 may have a stripe structure.

In this manner, effects similar to those when the cell structure has the rectangular shape can be obtained even if the cell structure is other than a rectangle.

Moreover, the high-concentration well region 13 may not necessarily be formed to have the same depth as that of the well region 5.

Figure 20:
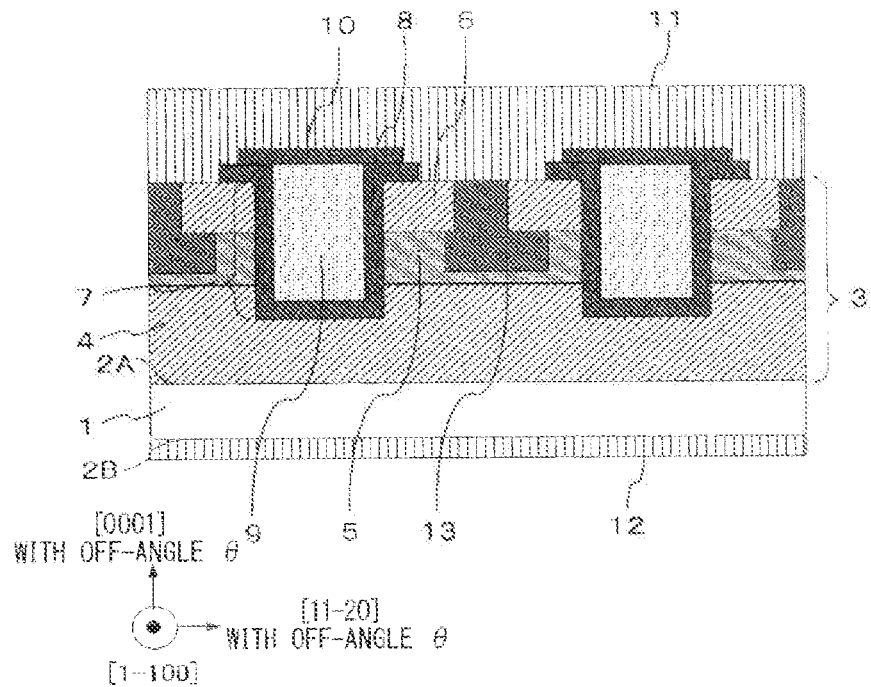
FIG. 20 is a cross-sectional view schematically showing one aspect of the silicon carbide semiconductor device in the first embodiment of the present invention.
Figure 21:
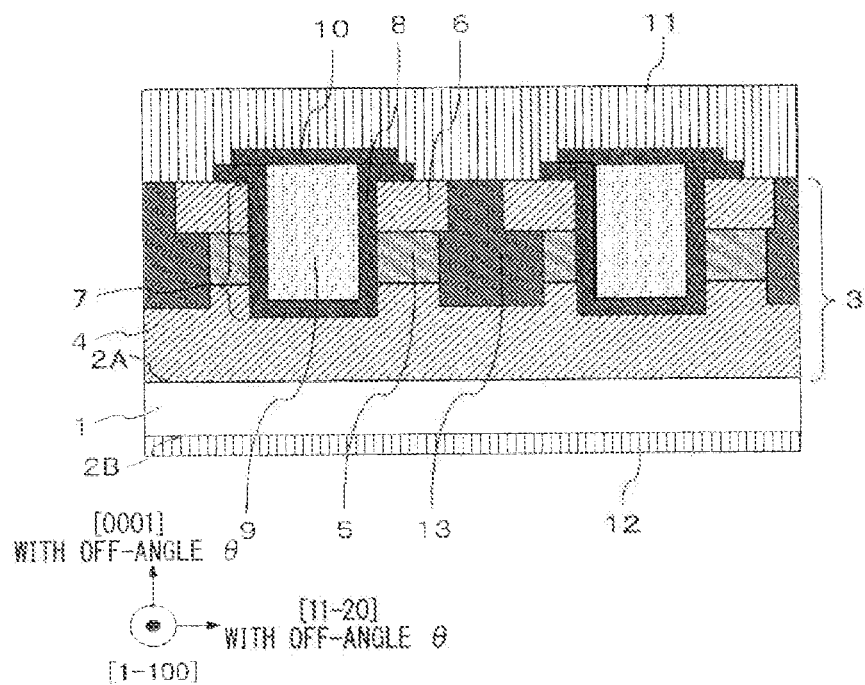
FIG. 21 is a cross-sectional view schematically showing one aspect of the silicon carbide semiconductor device in the first embodiment of the present invention.
Figure 22:
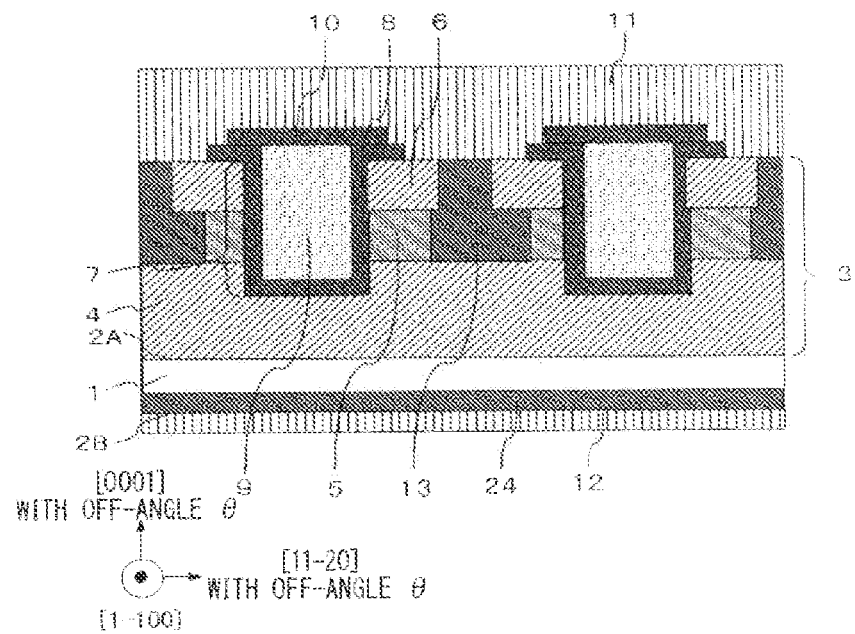
FIG. 22 is a cross-sectional view schematically showing one aspect of the silicon carbide semiconductor device in the first embodiment of the present invention.

For example, the bottom surface of the high-concentration well region 13 whose cross-sectional view is shown in FIG. 20 may be formed at a depth shallower than that of the bottom surface of the well region 5. The bottom surface of the high-concentration well region 13 whose cross-sectional view is shown in FIG. 21 may also be formed at a depth deeper than that of the bottom surface of the well region 5.

For the bottom surface of the high-concentration well region 13 formed at the depth deeper than that of the bottom surface of the well region 5, a depletion layer extending from the high-concentration well region 13 suppresses an occurrence of a punch-through breakdown in an OFF state, whereby the MOSFET can be more resistant to pressure.

In addition, this embodiment gives descriptions about the trench-gate MOSFET silicon carbide semiconductor device, and the present invention is not limited to the MOSFET. For example, effects similar to those in the case of the MOSFET are obtained even if the present invention is an IGBT in which p-type impurities are implanted to the second main surface side of the silicon carbide semiconductor substrate 1 to form a back surface impurity region 24, or in which the silicon carbide semiconductor substrate 1 is the p-type.

In this manner, the application of the present invention can achieve the trench-gate SiC-IGBT having gate characteristics including a stable operation, a low leakage current in an OFF state, a low switching loss, and high reliability of noise. Further, a current concentration in a channel surface of the particular side surface of the trench 7 can be prevented, allowing for a low on-resistance.

In addition, in this embodiment, nitrogen, phosphorus, or the like may be used as n-type impurities, and aluminum, boron, or the like may be used as p-type impurities.

Second Embodiment

Figure 23:
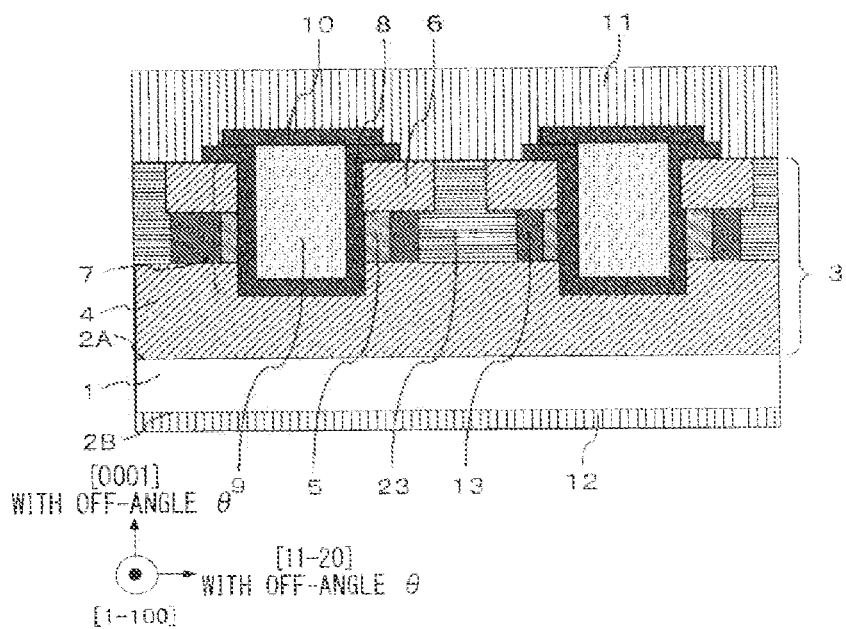
FIG. 23 is a cross-sectional view schematically showing a silicon carbide semiconductor device in a second embodiment of the present invention.

A configuration of a trench-gate MOSFET being a silicon carbide semiconductor device in a second embodiment of the present invention will be described. FIG. 23 is a schematic cross-sectional view showing the trench-gate MOSFET being the silicon carbide semiconductor device in the second embodiment of the present invention.

In the semiconductor device in this embodiment, a second high-concentration well region 23 having a p-type impurity concentration still higher than that of the high-concentration well region 13 is formed in the high-concentration well region 13 in the silicon carbide semiconductor device in the first embodiment. The other portions are similar to those as described in the first embodiment, so that detailed descriptions will be omitted here.

In FIG. 23, the side walls of the trench 7 facing each other cause the high-concentration well regions 13 in a horizontal direction in the diagram to have approximately the same width, the high-concentration well regions 13 not being the second high-concentration well region 23. Further, the p-type impurity concentration satisfies the relationship in which the well region 5< the high-concentration well region 13< the second high-concentration well region 23 in the stated order.

Next, effects of the second high-concentration well region 23 in the trench-gate MOSFET in this embodiment will be described.

It is clear from the result shown in FIG. 4 in the first embodiment that the fluctuation of the threshold voltage is particularly apparent when the distance between the high-concentration well region 13 and the sidewall surface of the trench 7 is 0.5 µm or less. Meanwhile, to secure the breakdown voltage in the OFF state of the silicon carbide semiconductor device, the p-type impurity concentration in the high-concentration well region 13 needs to be set to a high concentration of approximately $1 \times 10^{18}/cm^3$ to $5 \times 10^{18}/cm^3$.

To secure the breakdown voltage in the OFF state and also avoid great fluctuations in the threshold voltage due to the fluctuation in the distance between the high-concentration well region 13 and the side surface of the trench 7, the second high-concentration well region 23 having the second conductivity-type impurity concentration of approximately $1 \times 10^{18}/cm^3$ to $5 \times 10^{18}/cm^3$ may be provided in the high-concentration well region 13, the distance between the second high-concentration well region 23 and the side surface of the trench 7 may be set to 0.7 µm or more, and the high-concentration well region 13 may be provided to be able to adjust a fermi level, that is to say, to be able to adjust the threshold voltage of the well region 5 near the channel in accordance with the distance between the high-concentration well region 13 and the side surface of the trench 7.

In this manner, the trench-gate MOSFET being the silicon carbide semiconductor device in this embodiment can adjust the fermi level of the well region 5 independently of the breakdown voltage in the OFF state of the silicon carbide semiconductor device, so that the breakdown voltage in the OFF state can be secured while the threshold voltage can be controlled in a wider range.

Third Embodiment

Figure 24:
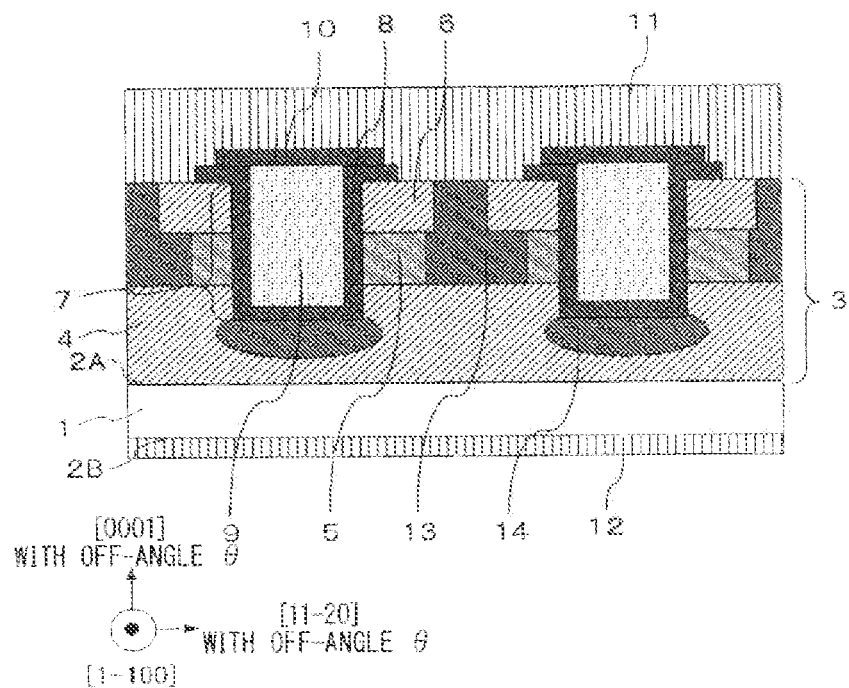
FIG. 24 is a cross-sectional view schematically showing a silicon carbide semiconductor device in a third embodiment of the present invention.

A configuration of a trench-gate MOSFET being a silicon carbide semiconductor device in a third embodiment of the present invention will be described. FIG. 24 is a schematic cross-sectional view showing the trench-gate MOSFET being the silicon carbide semiconductor device in the third embodiment of the present invention.

In the semiconductor device in this embodiment, a trench bottom surface protecting well region 14 of a p-type is formed on the bottom of the trench 7 in the silicon carbide semiconductor device in the first or the second embodiment. The other portions are similar to those as described in the first or the second embodiment, so that detailed descriptions will be omitted here.

In this manner, the p-type trench bottom surface protecting well region 14 is formed on the bottom of the trench 7, whereby the application of the high voltage to the gate insulating film 8 on the bottom of the trench 7 can be suppressed.

Figure 25:
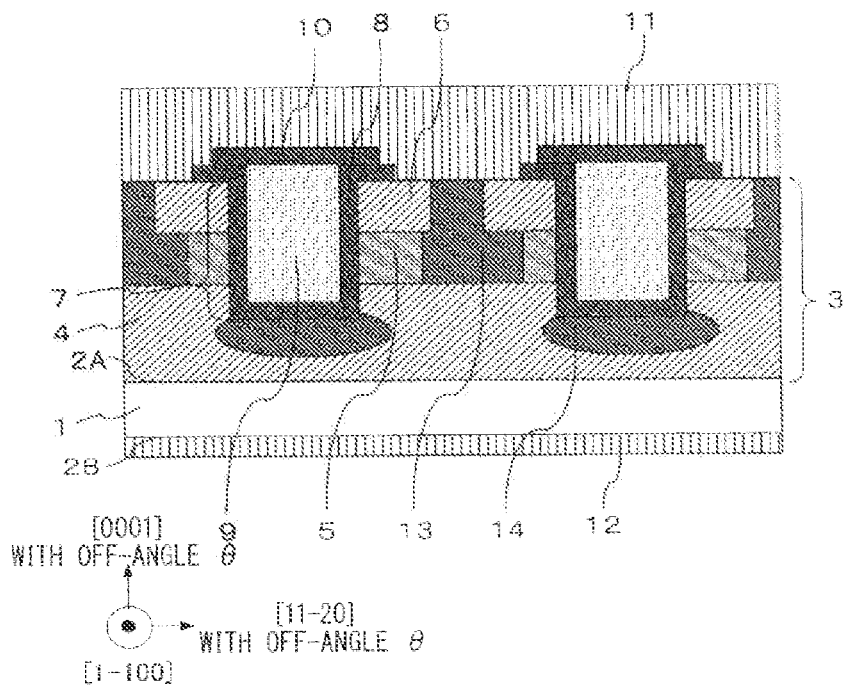
FIG. 25 is a cross-sectional view schematically showing one aspect of the silicon carbide semiconductor device in the third embodiment of the present invention.

Also as shown in a schematic cross-sectional view in FIG. 25, the trench bottom surface protecting well region 14 on the bottom surface of the trench 7 has different protruding distances from the sidewall surfaces of the trench 7 in the cross-sectional horizontal direction on the (11-20) plane side having the off-angle θ and on the (-1-120) plane side having the off-angle θ, and the protruding distance on the (11-20) plane side may be greater.

As in the present invention, the distances between the high-concentration well region 13 and the side surfaces of the trench 7 differ from each other depending on each of the sidewall surfaces of the trench 7, so that punch-through breakdown voltages differ from each other depending on each channel surface.

Therefore, the protruding distance of the trench bottom surface protecting well region 14 from the side surface of the trench 7 is determined in accordance with the distance between the high-concentration well region 13 and the side surface of the trench 7 (as in the proportional relationship), whereby the application of the high voltage to the gate insulating film 8 on the bottom of the trench 7 can be suppressed, and the occurrence of the punch-through breakdown can be prevented.

Herein, it is preferable that the trench bottom surface protecting well region 14 has the second conductivity-type impurity concentration of approximately $1 \times 10^{17}/cm^3$ to $5 \times 10^{18}/cm^3$.

Next, an example of a method for manufacturing the trench-gate MOSFET being the silicon carbide semiconductor device in this embodiment whose cross-sectional view is shown in FIG. 25 will be described.

The first embodiment gives descriptions about the method for manufacturing the trench-gate MOSFET without the trench bottom surface protecting well region 14 with reference to FIGS. 6 to 9, but the trench-gate MOSFET in this embodiment can be easily manufactured by slightly tilting an ion-implantation angle from a direction perpendicular to the front surface of the epitaxial layer 3, namely, a direction perpendicular to the first main surface 2A of the silicon carbide semiconductor substrate 1 to the [-1-120] direction when ion is implanted to the trench bottom surface protecting well region 14 after the trench 7 is formed as shown in FIG. 8.

Moreover, the trench-gate MOSFET in this embodiment can also be manufactured by a method in such manner that schematic cross-sectional views thereof are shown in FIGS. 26 to 30.

Figure 26:
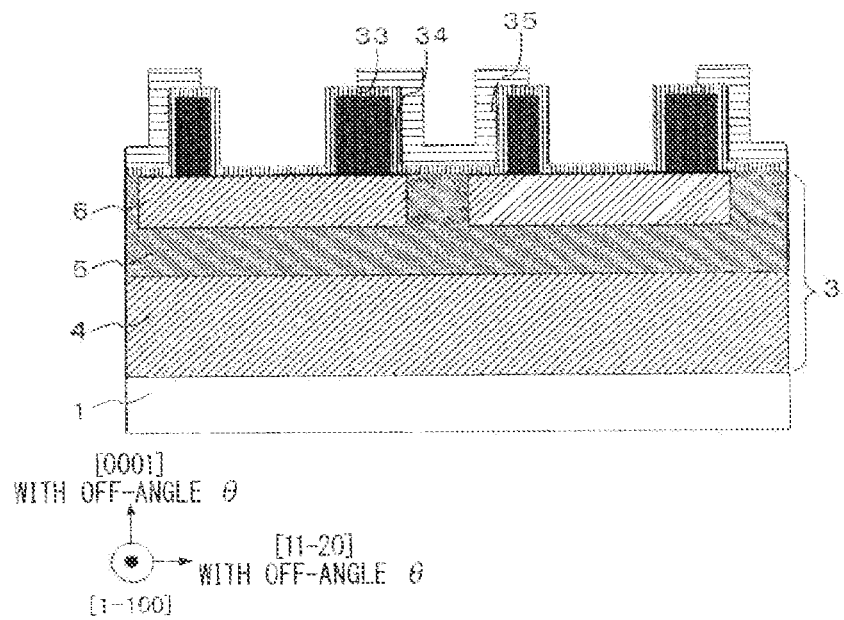
FIG. 26 is a schematic cross-sectional view schematically showing a method for manufacturing the silicon carbide semiconductor device in the third embodiment of the present invention.

FIG. 26 is the schematic cross-sectional view in which three kinds of masks are formed similarly to FIG. 11 in the first embodiment. Also in FIG. 26, the mask 34 made of the inorganic material, such as metal, is formed on the mask 33 made of the inorganic material, such as silicon oxide, for forming the trench 7 and the high-concentration well region 13 so as to cover the mask 33 and the front surface of the epitaxial layer 3, and then the mask 35 made of the organic material or the inorganic material is formed on the mask 34 so as to cover the implanted portion of the high-concentration well region 13.

Figure 27:
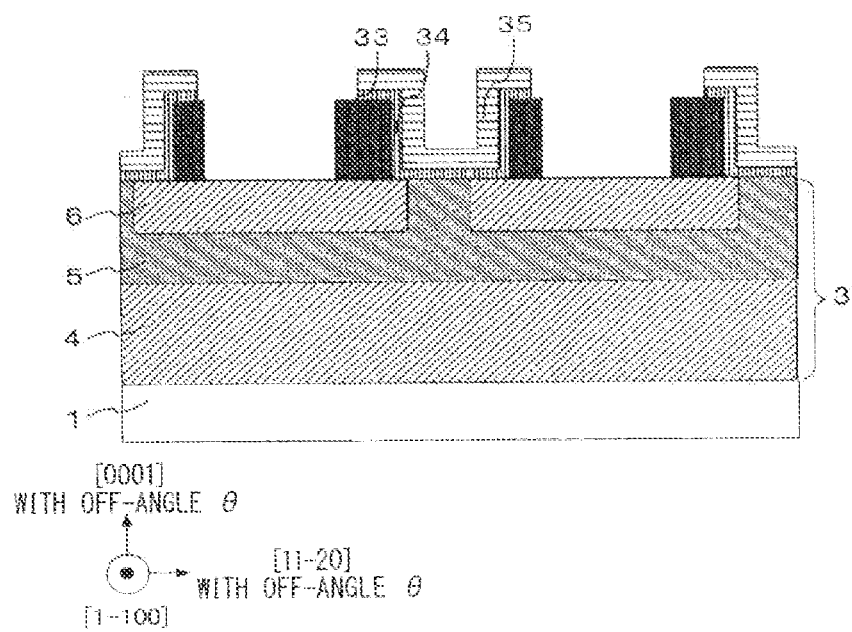
FIG. 27 is a schematic cross-sectional view schematically showing the method for manufacturing the silicon carbide semiconductor device in the third embodiment of the present invention.
Figure 28:
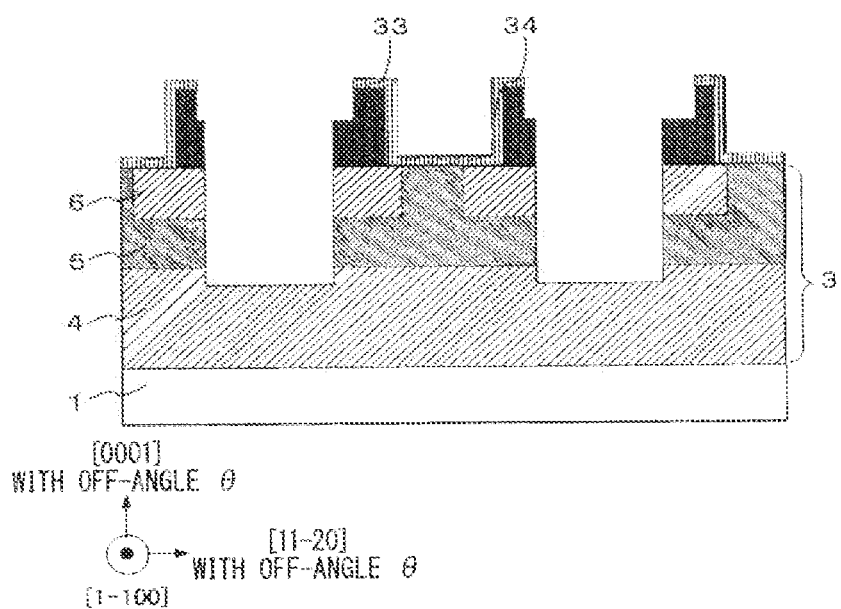
FIG. 28 is a schematic cross-sectional view schematically showing the method for manufacturing the silicon carbide semiconductor device in the third embodiment of the present invention.

Next, as shown in FIG. 27, the mask 34 that is not covered by the mask 35 is removed. Then, after removal of the mask 35, the trench 7 is formed by etching, as shown in FIG. 28. At this time, the upper portion of the mask 33 that is not covered by the mask 34 is etched in advance, and the trench 7 is etched after the portion having a small thickness is formed in the mask 33. Next, after removal of the mask 34, the p-type impurity ion is implanted, as shown in FIG. 29.

Figure 29:
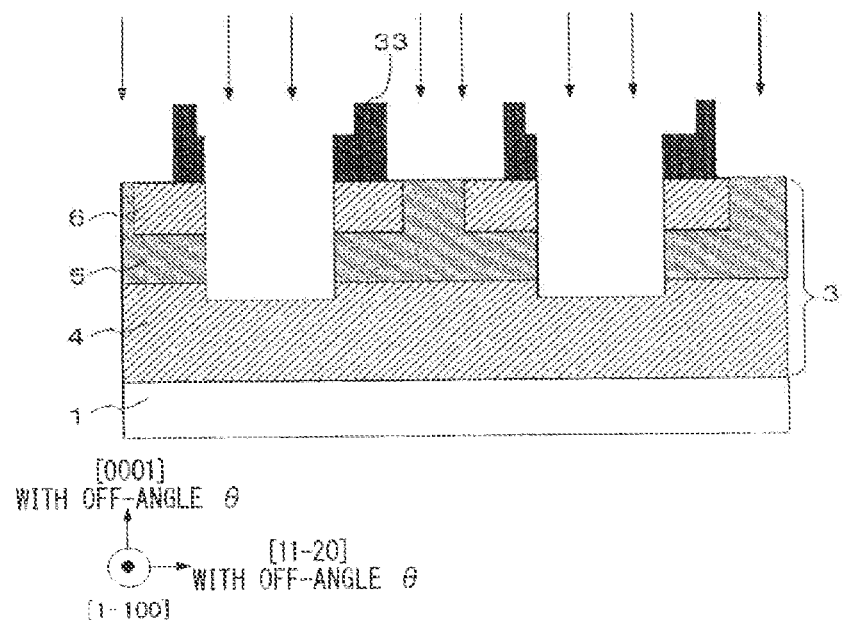
FIG. 29 is a schematic cross-sectional view schematically showing one aspect of the method for manufacturing the silicon carbide semiconductor device in the third embodiment of the present invention.
Figure 30:
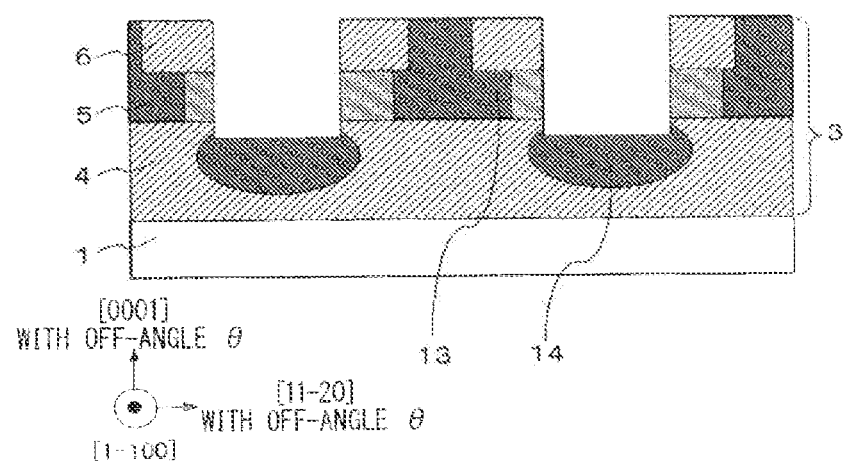
FIG. 30 is a schematic cross-sectional view schematically showing one aspect of the method for manufacturing the silicon carbide semiconductor device in the third embodiment of the present invention.

Here, the position of the mask 33 having the small thickness in FIG. 29 is formed correspondingly to the trench bottom surface protecting well region 14, so that the high-concentration well region 13 and the trench bottom surface protecting well region 14 can be manufactured by the same ion-implantation step, as shown in the schematic cross-sectional view in FIG. 30. This manufacturing method can form the distance between the side wall of the trench 7 and the high-concentration well region 13 more accurately.

In this manner, the structure of the trench-gate MOSFET in this embodiment can increase the protruding distance of the trench bottom surface protecting well region 14 from the side wall of the trench 7, whereby the punch-through breakdown can be suppressed more effectively, the trench bottom surface protecting well region 14 being formed on the lower portion of the side surface of the trench 7 tilted closest to the (−1-120) plane that conceivably has the lowest punch-through breakdown voltage.

In addition, the first to third embodiments give descriptions on the assumption that the first conductivity type is the n-type and the second conductivity type is the p-type, but this is not restrictive. The similar effects are obtained even if the first conductivity type is the p-type and the second conductivity type is the n-type.

In the MOSFETs described in the first to third embodiments, the gate insulating film is not necessarily an oxide film such as $SiO_2$, and it may be an insulating film except for the oxide film, or a combination of the insulating film except for the oxide film and the oxide film.

DESCRIPTION OF NUMERALS 1 silicon carbide semiconductor substrate; 3 epitaxial layer; 4 drift region; 5 well region; 6 source region; 7 trench; 8 gate insulating film; 9 gate electrode; 10 interlayer insulating film; 11 source electrode; 12 drain electrode; 13 high-concentration well region; 14 trench bottom surface protecting well region; 18 first sidewall surface; 19 second sidewall surface; 22 mark; 23 second high-concentration well region; 24 back surface impurity region; 30 to 37 resist mask, mask.

The invention claimed is:

1. A silicon carbide semiconductor device, comprising:
a drift region of a first conductivity type that is formed on a first main surface of a silicon carbide semiconductor substrate having an off-angle and is made of silicon carbide;
a well region of a second conductivity type that is formed on a surface of said drift region and is made of silicon carbide;
a source region of the first conductivity type that is selectively formed in a surface layer portion of said well region and is made of silicon carbide;
a trench that penetrates said well region from a surface of said source region and reaches said drift region;
a gate electrode that is formed inside said trench through a gate insulating film;
a source electrode that is connected to said well region and said source region;
a drain electrode that is formed on a second main surface while being in contact with said silicon carbide semiconductor substrate, the second main surface being a surface opposite to the first main surface of said silicon carbide semiconductor substrate;
a high-concentration well region of the second conductivity type that is formed in said well region and has an impurity concentration higher than that of said well region, wherein a distance from a first sidewall surface of said trench to said high-concentration well region is shorter than a distance from a second sidewall surface of said trench to said high-concentration well region, the second sidewall surface facing the first sidewall surface of said trench through said gate electrode in said trench;
said first main surface has an off-angle tilted from a (0001) plane in an [11-20] axis direction;
said first sidewall surface is a surface close to a (11-20) plane; and
said second sidewall surface is a surface close to a (−1-120) plane.

2. A silicon carbide semiconductor device, comprising:
a drift region of a first conductivity type that is formed on a first main surface of a silicon carbide semiconductor substrate having an off-angle and is made of silicon carbide;
a well region of a second conductivity type that is formed on a surface of said drift region and is made of silicon carbide;
a source region of the first conductivity type that is selectively formed in a surface layer portion of said well region and is made of silicon carbide;
a trench that penetrates said well region from a surface of said source region and reaches said drift region;
a gate electrode that is formed inside said trench through a gate insulating film;
a source electrode that is connected to said well region and said source region;
a drain electrode that is formed on a second main surface while being in contact with said silicon carbide semiconductor substrate, the second main surface being a surface opposite to the first main surface of said silicon carbide semiconductor substrate;
a high-concentration well region of the second conductivity type that is formed in said well region and has an impurity concentration higher than that of said well region, wherein a distance from a first sidewall surface of said trench to said high-concentration well region is shorter than a distance from a second sidewall surface of said trench to said high-concentration well region, the second sidewall surface facing the first sidewall surface of said trench through said gate electrode in said trench,
wherein a threshold voltage of a field-effect transistor formed in said first sidewall surface is lower than a threshold voltage of a field-effect transistor formed in said second sidewall surface when the distance from said first sidewall surface to said high-concentration well region is the same as the distance from said second sidewall surface to said high-concentration well region.

3. The silicon carbide semiconductor device according to claim 2, wherein
said first main surface has an off-angle tilted from a (0001) plane in an [11-20] axis direction,
said first sidewall surface is a surface close to a (11-20) plane, and
said second sidewall surface is a surface close to a (−1-120) plane.

4. The silicon carbide semiconductor device according to claim 2, wherein said off-angle is 1° or more and 10° or less.

5. The silicon carbide semiconductor device according to claim 2, wherein said high-concentration well has a second conductivity-type impurity concentration of $5 \times 10^{17}$/cm$^3$ or more and $5 \times 10^{18}$/cm$^3$ or less.

6. The silicon carbide semiconductor device according to claim 2, wherein a second high-concentration well region of the second conductivity type that has a second conductivity-type impurity concentration higher than that of said high-concentration well region is provided inside said high-concentration well region at a distance from the side wall of said trench greater than the distance therefrom to said high-concentration well region.

7. The silicon carbide semiconductor device according to claim 2, wherein a trench bottom surface protecting well region is included in said drift region on a bottom of said trench.

8. The silicon carbide semiconductor device according to claim 7, wherein said trench bottom surface protecting well region has a greater protruding distance from a side wall of said trench on said first sidewall surface side than on said second sidewall surface side.

9. A method for manufacturing a silicon carbide semiconductor device, comprising:
    forming a drift region of a first conductivity type made of silicon carbide on a first main surface of a silicon carbide semiconductor substrate having an off-angle;
    forming a well region of a second conductivity type made of silicon carbide on a surface of said drift region;
    forming a source region of the first conductivity type made of silicon carbide selectively in a surface layer portion of said well region;
    forming a trench that penetrates said well region from a surface of said source region and reaches said drift region;
    forming a gate electrode inside said trench through a gate insulating film;
    forming a source electrode in contact with said well region and said source region;
    forming a drain electrode on a second main surface being a surface opposite to the first main surface of said silicon carbide semiconductor substrate; and
    forming, in said well region, a high-concentration well region of the second conductivity type having a second conductivity-type impurity concentration higher than that of said well region such that a distance from a first sidewall surface of said trench is shorter than a distance from a second sidewall surface of said trench, the second sidewall surface facing the first sidewall surface of said trench through said gate electrode in said trench,
    wherein the high-concentration well region is formed with reference to a mark provided in said forming a trench,
    said first main surface has an off-angle tilted from a (0001) plane in an [11-20] axis direction,
    said first sidewall surface is a surface close to a (11-20) plane, and
    said second sidewall surface is a surface close to a (−1-120) plane.

10. The method for manufacturing a silicon carbide semiconductor device according to claim 9, wherein the distance between said trench and said high-concentration well region is determined by one mask.

11. The method for manufacturing a silicon carbide semiconductor device according to claim 9, further comprising forming a trench bottom surface protecting well region of the second conductivity type on a bottom surface of said trench,
    wherein ion is implanted to said trench bottom surface protecting well region by tilting an ion angle of an ion implantation to the first sidewall surface side after said trench is formed.

12. The method for manufacturing a silicon carbide semiconductor device according to claim 10, further comprising forming a trench bottom surface protecting well region of the second conductivity type on a bottom surface of said trench,
    wherein the forming said trench bottom surface protecting well region on a bottom surface of said trench and the forming a high-concentration well region are performed by the same ion implantation.

* * * * *